(12) United States Patent
Matsumoto et al.

(10) Patent No.: US 8,547,148 B2
(45) Date of Patent: Oct. 1, 2013

(54) SEMICONDUCTOR DEVICE WITH DYNAMICALLY CALIBRATED OSCILLATOR

(75) Inventors: Akira Matsumoto, Hino (JP); Tatsunori Usugi, Hamura (JP)

(73) Assignee: Hitachi, Ltd., Tokyo (JP)

( * ) Notice: Subject to any disclaimer, the term of this patent is extended or adjusted under 35 U.S.C. 154(b) by 202 days.

(21) Appl. No.: 13/026,245

(22) Filed: Feb. 12, 2011

(65) Prior Publication Data

US 2011/0234274 A1 Sep. 29, 2011

(30) Foreign Application Priority Data

Mar. 29, 2010 (JP) .................................. 2010-074762

(51) Int. Cl.
*H03L 7/06* (2006.01)

(52) U.S. Cl.
USPC ............................ 327/156; 375/376; 331/16

(58) Field of Classification Search
USPC ........... 327/159, 157, 156; 375/376; 331/10, 331/11, 16
See application file for complete search history.

(56) References Cited

U.S. PATENT DOCUMENTS

| | | | |
|---|---|---|---|
| 7,103,337 B2 * | 9/2006 | Uozumi et al. ............... | 455/255 |
| 7,336,134 B1 * | 2/2008 | Janesch et al. .............. | 331/36 C |
| 7,349,514 B2 * | 3/2008 | Meltzer et al. ................ | 375/376 |
| 7,408,416 B2 | 8/2008 | Tanaka | |
| 8,111,798 B2 | 2/2012 | Sai | |
| 2003/0048139 A1 * | 3/2003 | Chien et al. ..................... | 331/11 |
| 2003/0227341 A1 | 12/2003 | Sawada | |

FOREIGN PATENT DOCUMENTS

| | | |
|---|---|---|
| JP | 04-273618 A | 9/1992 |
| JP | 2004-15387 A | 1/2004 |
| JP | 2004-254162 A | 9/2004 |
| JP | 2004-312726 A | 11/2004 |
| JP | 2009-194611 A | 8/2009 |

OTHER PUBLICATIONS

Office Action issued Jan. 17, 2012, in Japanese Patent Application No. 2010-074762.
Office Action issued May 15, 2012, in Japanese Patent Application No. 2010-074762.

* cited by examiner

*Primary Examiner* — Ryan Jager
(74) *Attorney, Agent, or Firm* — Miles & Stockbridge P.C.

(57) ABSTRACT

A digital compensation phase locked loop circuit of a semiconductor device includes a phase locked loop circuit including a voltage controlled oscillator having capacitors at oscillation nodes and consecutively controlled by an applied voltage, and a digital compensation circuit which variably controls the capacitors at the oscillation nodes of the voltage controlled oscillator in accordance with an input phase difference. A gain of the conventional voltage controlled oscillator whose gain is determined by an applied voltage is discretely changed by a control signal of the digital compensation circuit. The digital compensation circuit dynamically controls the gain so as to secure the optimum phase margin by applying a load (capacitor) to the oscillation node of the voltage controlled oscillator with respect to a phase lead and decreasing the load (capacitor) with respect to a phase delay.

1 Claim, 11 Drawing Sheets

SEMICONDUCTOR DEVICE WITH DYNAMICALLY CALIBRATED OSCILLATOR

CROSS-REFERENCE TO RELATED APPLICATION

The present application claims priority from Japanese Patent Application No. 2010-074762 filed on Mar. 29, 2010, the content of which is hereby incorporated by reference to this application.

TECHNICAL FIELD OF THE INVENTION

The present invention relates to a semiconductor device, and more particularly to a technology effectively applied to a digital equivalent technology that replaces a part of an analog circuit such as a phase locked loop (PLL) circuit with a digital circuit advantageous in process migration.

BACKGROUND OF THE INVENTION

In the LSI for a large-scale information communication equipment and the LSI for a mobile communication equipment, the reduction in power and area has been an important task to be achieved. One of the solutions thereof includes the miniaturization of the process, and it is advantageous also in the low-voltage operation. However, the design conditions become stricter in terms of characteristics of an analog circuit such as dynamic range and variation. Therefore, a digital circuit advantageous in the miniaturization of process is used as an equivalent circuit of an analog circuit. The digital equivalent circuit compensates for performance deteriorations of the analog circuit such as the element variation due to the area reduction and the reduction of the dynamic range due to the low-voltage operation (digital assist).

For example, in the control methods described in Japanese Patent Application Laid-Open Publication No. 4-273618 (Patent Document 1) and U.S. Pat. No. 7,408,416 (Patent Document 2), a circuit is added in a loop of a phase locked loop circuit to control a control voltage input to a voltage controlled oscillator, thereby achieving the desired characteristics.

SUMMARY OF THE INVENTION

As shown in FIG. 1, a conventional phase locked loop circuit 100 is made up of a phase frequency comparator (PFC) 101 which detects a phase difference between a reference clock (REFCLK) and a feedback clock (FBCLK), a charge pump (CP) 102 which injects a current corresponding to the phase difference, a loop filter (LF) 103 which converts the injected current into a voltage and determines a cutoff frequency of the phase locked loop circuit 100, a voltage controlled oscillator (VCO) 104 which controls an oscillation frequency in accordance with an applied voltage and a divider (DIV) 105 which divides the frequency to return it as the feedback clock to the phase frequency comparator 101.

In order to maintain the jitter characteristics of the phase locked loop circuit 100, a current source used for the voltage controlled oscillator 104 and others and a capacitor of the loop filter 103 are designed to have a large area.

Furthermore, the loop filter 103 has a large area in order to secure the phase margin which is a factor of a stable oscillation, and it accounts for a large proportion of the entire area of the phase locked loop circuit 100. When the loop filter 103 is reduced in size, the occurrence of phase delay is markedly increased, and the phase margin required for the stable oscillation of the phase locked loop circuit 100 is reduced.

Also, in the control methods of the Patent Document 1 and the Patent Document 2, the voltage addition is performed for the control voltage of the voltage controlled oscillator determined by the loop filter, but they are not suitable for the high-speed tracking.

Therefore, the present invention is made for solving the problems described above, and a representative object of the present invention is to provide a semiconductor device which secures a phase margin by applying a digital compensation circuit advantageous in process migration in order to maintain the characteristics while reducing the area of the phase locked loop circuit.

The above and other objects and novel characteristics of the present invention will be apparent from the description of the present specification and the accompanying drawings.

The following is a brief description of an outline of the typical invention disclosed in the present application.

That is, as a typical invention disclosed in the present application, a semiconductor device includes: a phase locked loop circuit including a voltage controlled oscillator having capacitors at oscillation nodes and consecutively controlled by an applied voltage; and a digital compensation circuit which variably controls the capacitors at the oscillation nodes of the voltage controlled oscillator in accordance with an input phase difference.

More specifically, a VCO gain of a conventional voltage controlled oscillator determined by an applied voltage is discretely changed by a control signal of a digital compensation circuit. The digital compensation circuit dynamically controls the VCO gain so as to secure the optimum phase margin by applying a load (capacitor) to an oscillation node of the voltage controlled oscillator with respect to a phase lead and decreasing the load (capacitor) with respect to a phase delay.

The effects obtained by the typical embodiment of the invention disclosed in the present application will be briefly described below.

That is, as an effect obtained by the typical embodiment of the invention, by applying a digital compensation circuit advantageous in process migration to a part of an analog circuit of a phase locked loop circuit, an optimum phase margin can be secured while reducing an area of the phase locked loop circuit and maintaining the characteristics.

BRIEF DESCRIPTIONS OF THE DRAWINGS

DESCRIPTIONS OF THE PREFERRED EMBODIMENTS

Hereinafter, an embodiment of the present invention will be described in detail with reference to the accompanying drawings. Note that components having the same function are denoted by the same reference symbols throughout the drawings describing the embodiment, and the repetitive description thereof will be omitted.

Figure 1:
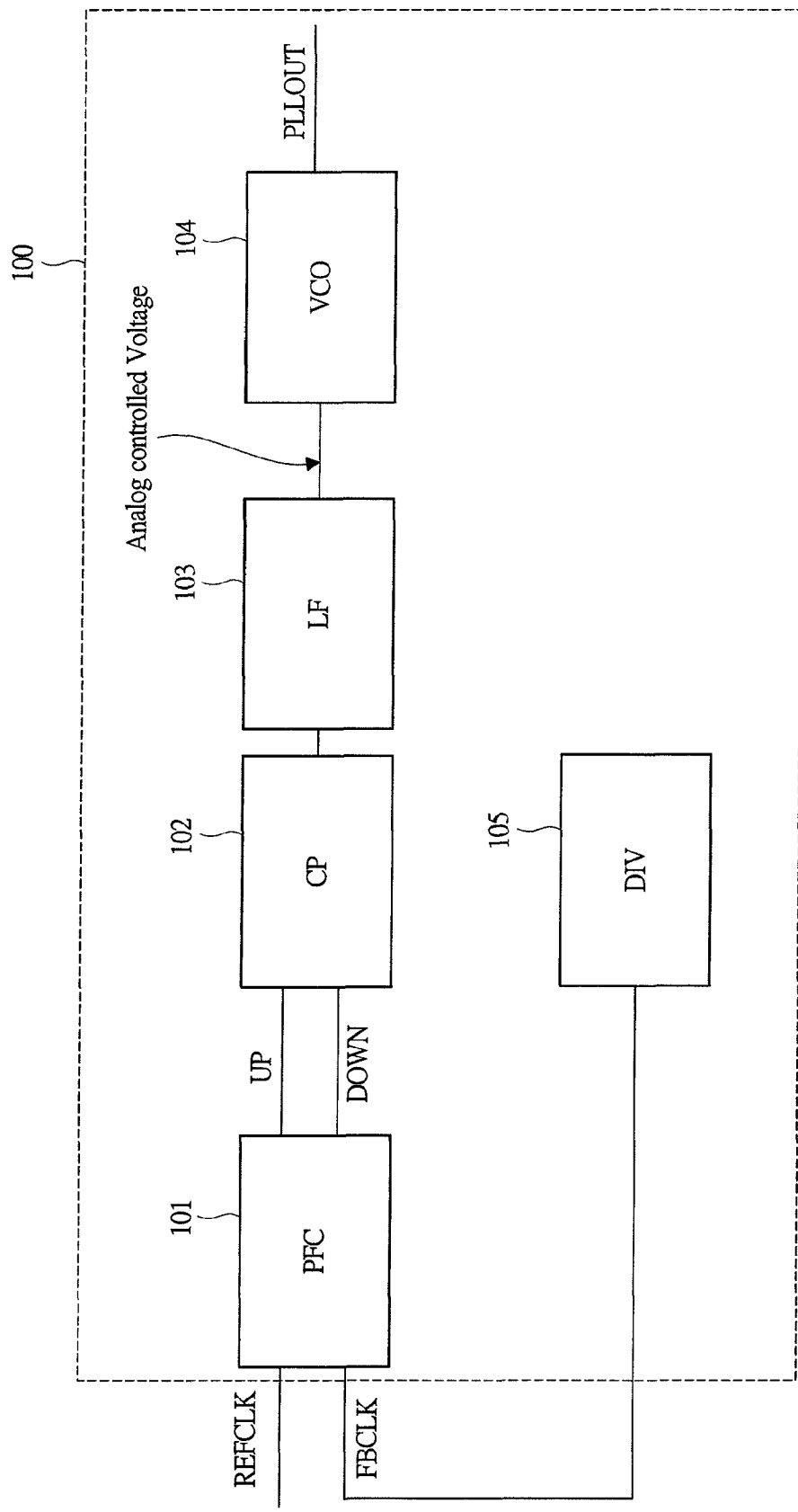
FIG. 1 is a block diagram describing a phase locked loop circuit in a conventional semiconductor device.
Figure 2:
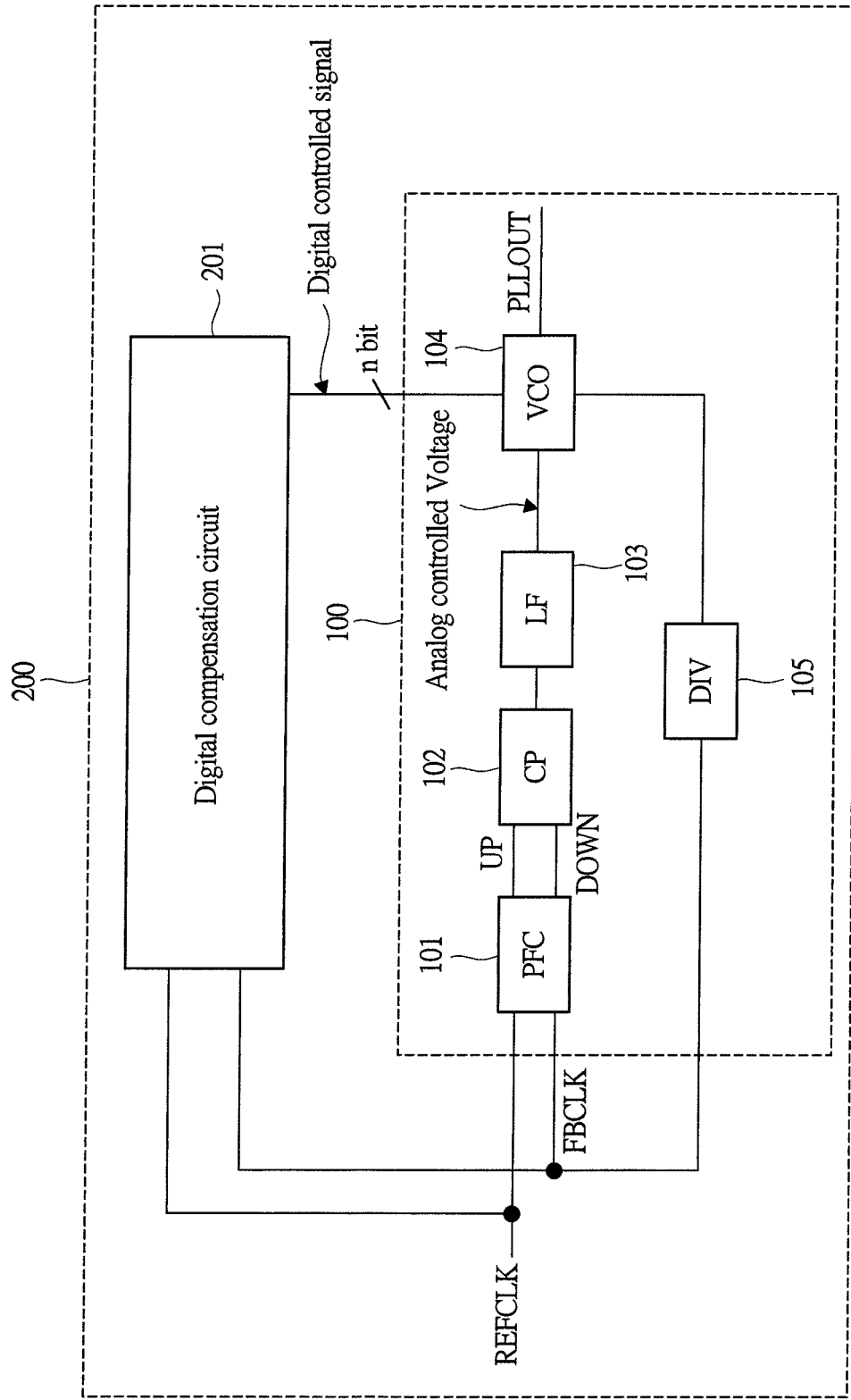
FIG. 2 is a block diagram showing the configuration of a digital compensation phase locked loop circuit in a semiconductor device according to an embodiment of the present invention.

FIG. 2 is a block diagram showing the configuration of a phase locked loop circuit in a semiconductor device according to an embodiment of the present invention. As shown in FIG. 2, in a digital compensation phase locked loop circuit 200 according to the present embodiment, a digital compensation circuit 201 is connected to the voltage controlled oscillator 104 of the conventional phase locked loop circuit 100 shown in FIG. 1. The digital compensation circuit 201 determines the increase and decrease of the load (capacitor) connected to the oscillation node of the voltage controlled oscillator 104 and it takes apart of the function as an equivalent circuit of the phase locked loop circuit 100 which discretely controls the oscillation frequency. The area reduction and the power reduction can be achieved by applying the digital compensation circuit 201 to the phase locked loop circuit 100 as an equivalent circuit of an analog circuit. For example, the digital compensation circuit 201 can take apart of the function as an equivalent circuit of the charge pump 102, the loop filter 103 and the voltage controlled oscillator 104 of the phase locked loop circuit 100 shown in FIG. 1.

The usual drawing process is performed by the phase locked loop circuit 100, and after the phase lock, the digital compensation circuit 201 dynamically operates so as to secure the optimum phase margin by increasing the number of activated loads (capacitors) connected to the voltage controlled oscillator 104 with respect to the phase delay and decreasing it with respect to the phase lead.

In the method of the present embodiment, the phase compensation is performed for the miniaturized loop filter 103. The voltage controlled oscillator 104 performs the highly accurate tracking by means of an analog controlled voltage when the phase difference detected by the phase frequency comparator 101 is small (smaller than the sensitivity of the digital compensation circuit 201), and it performs an operation combining the high-speed tracking by means of the discrete signal processing of the digital compensation circuit 201 and the highly accurate tracking by means of the analog control when the phase difference is large.

The size reduction of the loop filter 103 can be achieved by providing the digital compensation circuit 201 with the equivalent circuit having a function of modulating the phase. Furthermore, since an arithmetic circuit used for the digital compensation circuit 201 is made up of a digital circuit, it is possible to take an advantage of the process migration.

As described above, the digital compensation circuit 201 making the best use of the scale merit can be generally applied to the analog circuits as an equivalent circuit taking a part of the function. By connecting the digital compensation circuit 201 in parallel to the phase locked loop circuit 100 like in the present embodiment shown in FIG. 2, the characteristics of the phase locked loop circuit 100 whose area and power are reduced can be maintained.

In the present embodiment, the phase locked loop 100 maintains the oscillation of the voltage controlled oscillator 104 so as to minimize the phase difference between the reference clock (REFCLK) and the feedback clock (FBCLK), and discretely performs the frequency modulation of the voltage controlled oscillator 104 so as to obtain the optimum phase margin by the digital compensation circuit 201.

Figure 3:
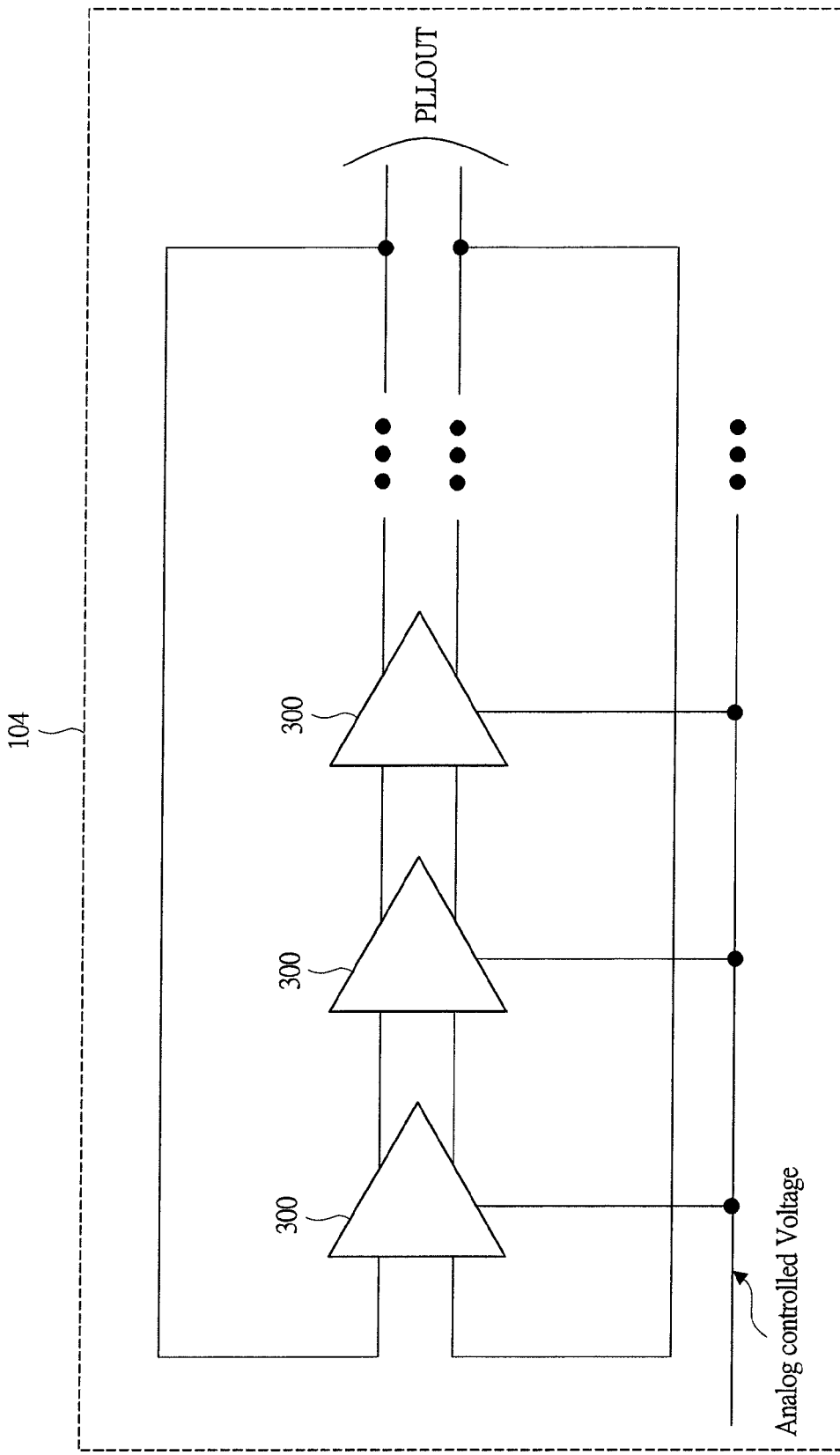
FIG. 3 is a block diagram showing the configuration of a voltage controlled oscillator in the semiconductor device according to an embodiment of the present invention.
Figure 4:
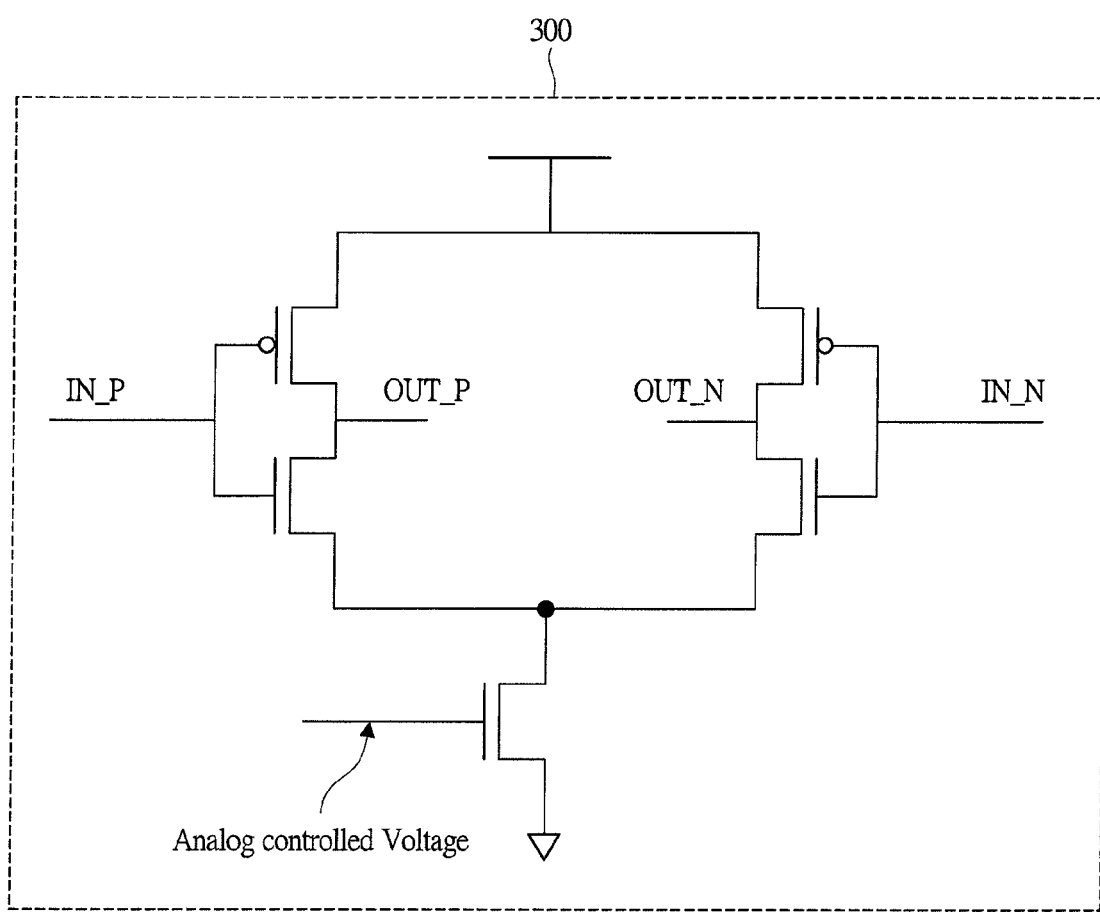
FIG. 4 is a block diagram describing a differential amplifier in the semiconductor device according to an embodiment of the present invention.

FIG. 3 is a block diagram showing the configuration of the voltage controlled oscillator. FIG. 4 is a block diagram describing a differential amplifier. As shown in FIG. 3, the voltage controlled oscillator 104 is made up of a ring oscillator in which differential amplifiers 300 are connected in multiple stages. As shown in FIG. 4, the differential amplifier 300 determines the oscillation frequency by applying an analog controlled voltage to the current source of the differential amplifier 300.

Figure 5:
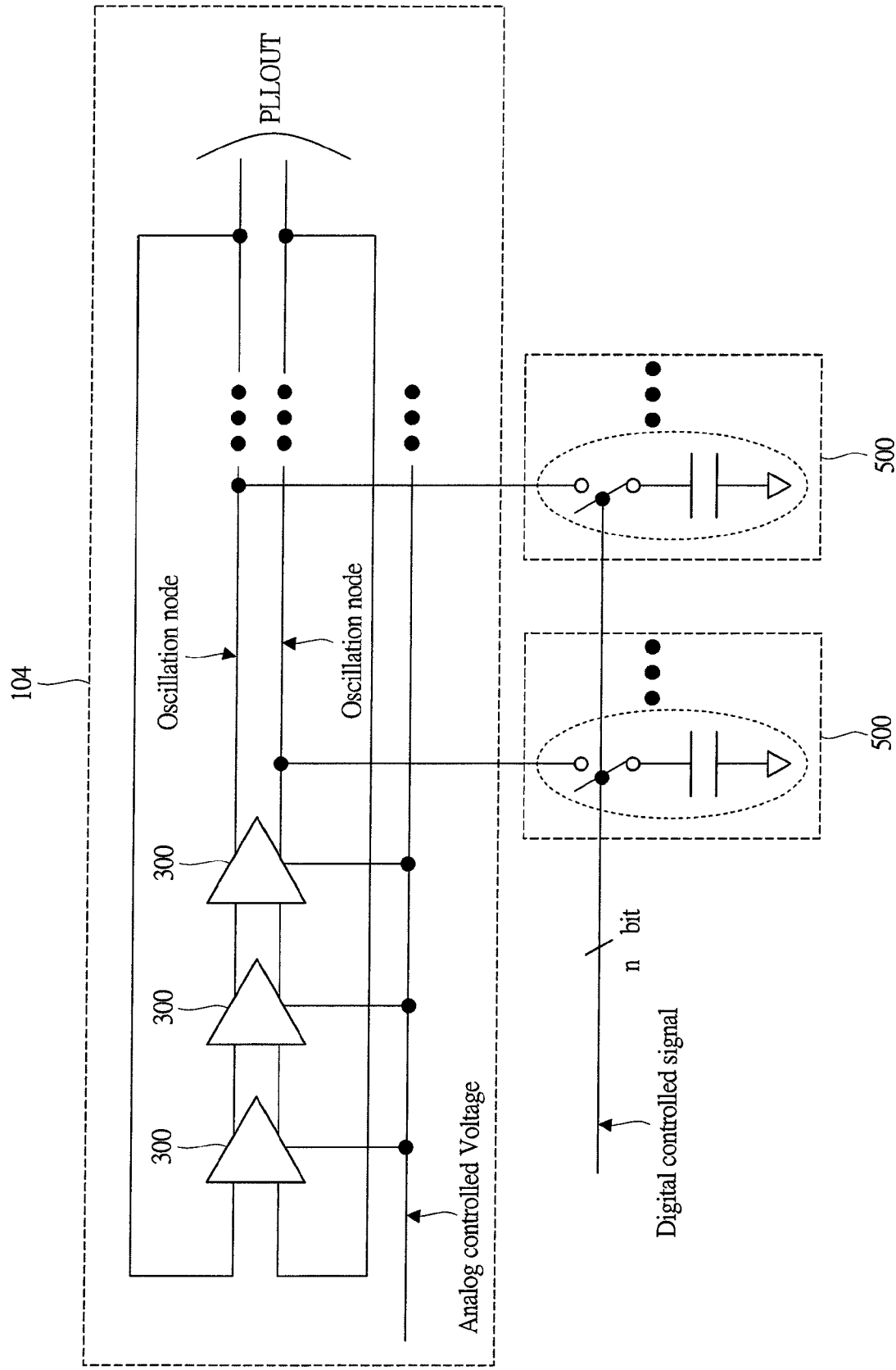
FIG. 5 is a block diagram showing the configuration of a voltage controlled oscillator in the semiconductor device according to an embodiment of the present invention.
Figure 6:
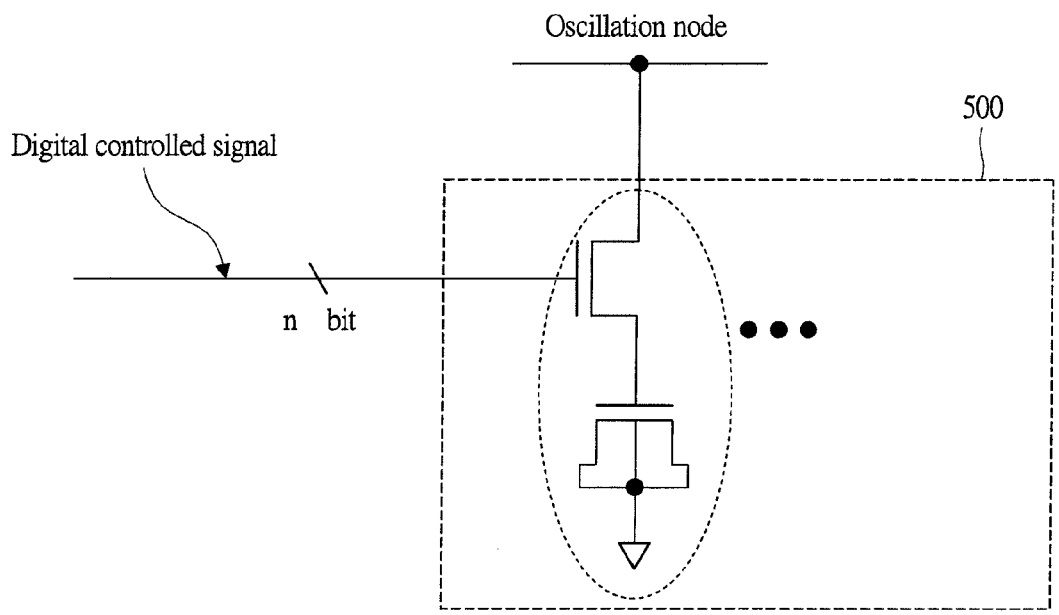
FIG. 6 is a block diagram describing the configuration of a MOS capacitor array in the semiconductor device according to an embodiment of the present invention.
Figure 7:
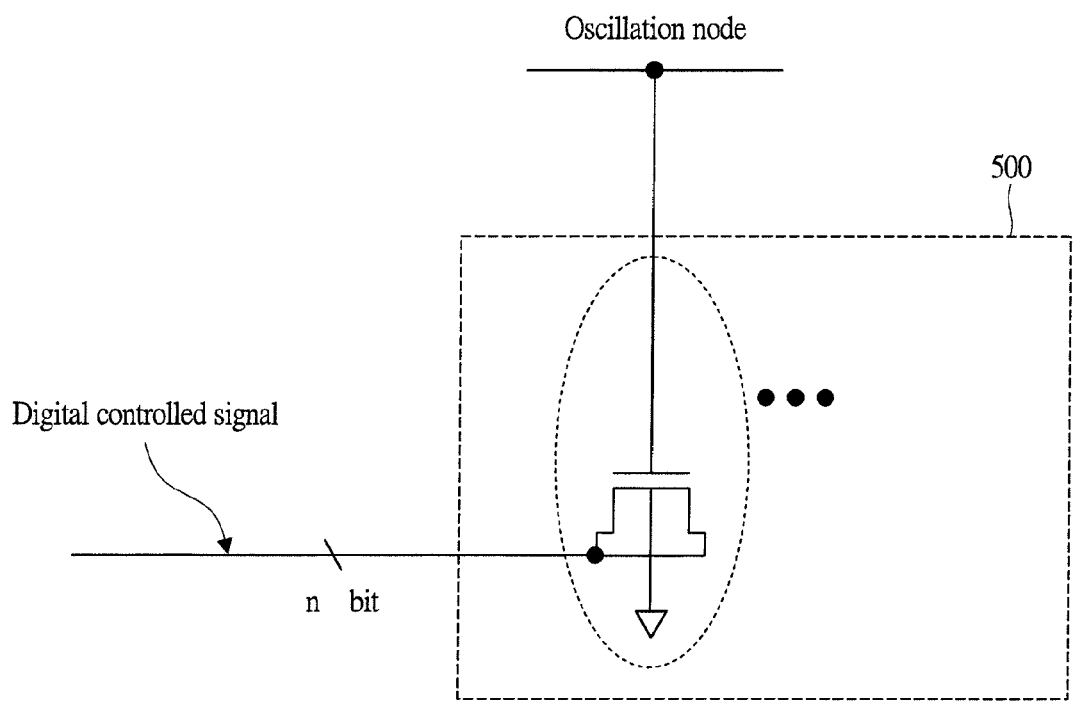
FIG. 7 is a block diagram describing another configuration of the MOS capacitor array in the semiconductor device according to an embodiment of the present invention.

FIG. 5 is a block diagram showing the configuration of the voltage controlled oscillator. FIG. 6 and FIG. 7 are block diagrams describing the configuration of a MOS capacitor array. The digital compensation circuit 201 according to the present embodiment modulates the oscillation frequency determined by the analog controlled voltage with a digital controlled signal. The frequency modulation is achieved by connecting a plurality of MOS capacitor arrays 500 made up of a plurality of switches and capacitors as shown in FIG. 5 to the oscillation nodes of the voltage controlled oscillator 104 and turning ON/OFF the switches in the MOS capacitor arrays 500 with the digital controlled signal. In the present embodiment, these MOS capacitor arrays 500 can minutely change the frequency of GHz order, and the MOS capacitor array 500 in which the MOS capacitors beneficial to the size reduction are connected in an array for plural bits is formed.

As a specific example, the MOS capacitor array 500 is made up of MOS switches controlled by the digital controlled signal and capacitors each formed of a MOS as shown in FIG. 6. Alternatively, it is made up of capacitors each formed of a MOS controlled by the digital controlled signal as shown in FIG. 7.

Figure 8:
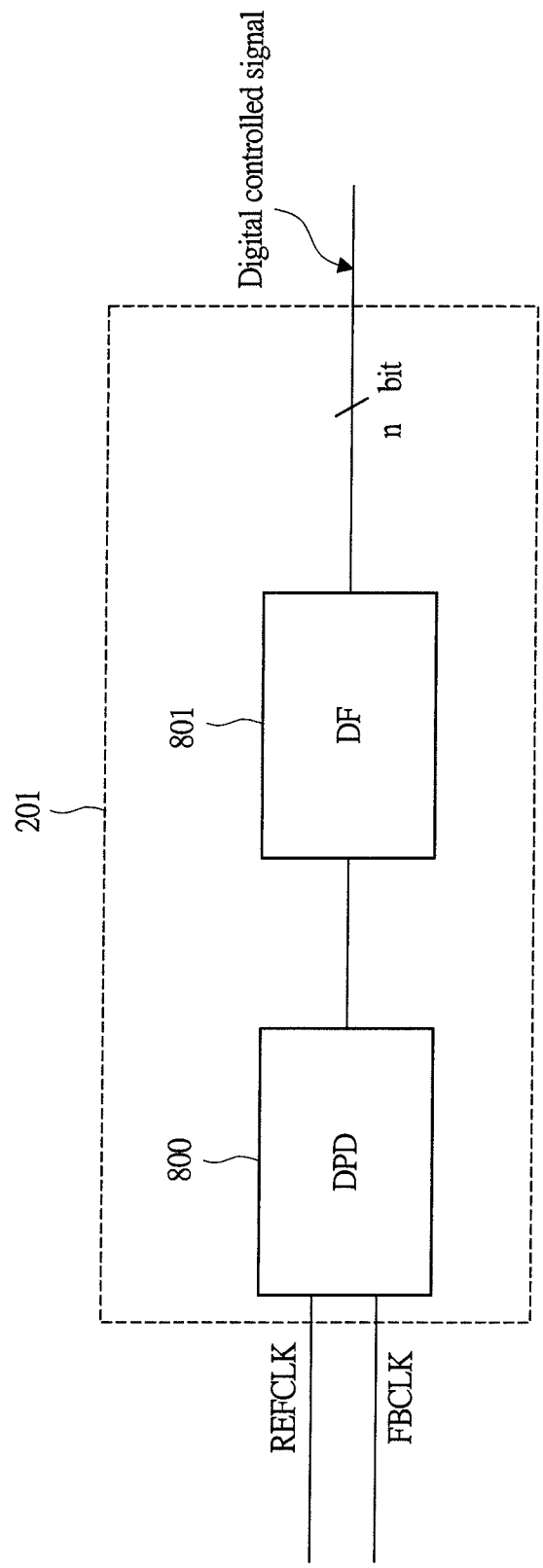
FIG. 8 is a block diagram describing the configuration of a digital compensation circuit in the semiconductor device according to an embodiment of the present invention.

FIG. 8 is a block diagram describing the configuration of the digital compensation circuit. As shown in FIG. 8, the digital compensation circuit 201 is made up of a digital phase comparator (DPD) 800 and a digital filter (DF) 801 which carries out operations of the phase comparison result.

Figure 9:
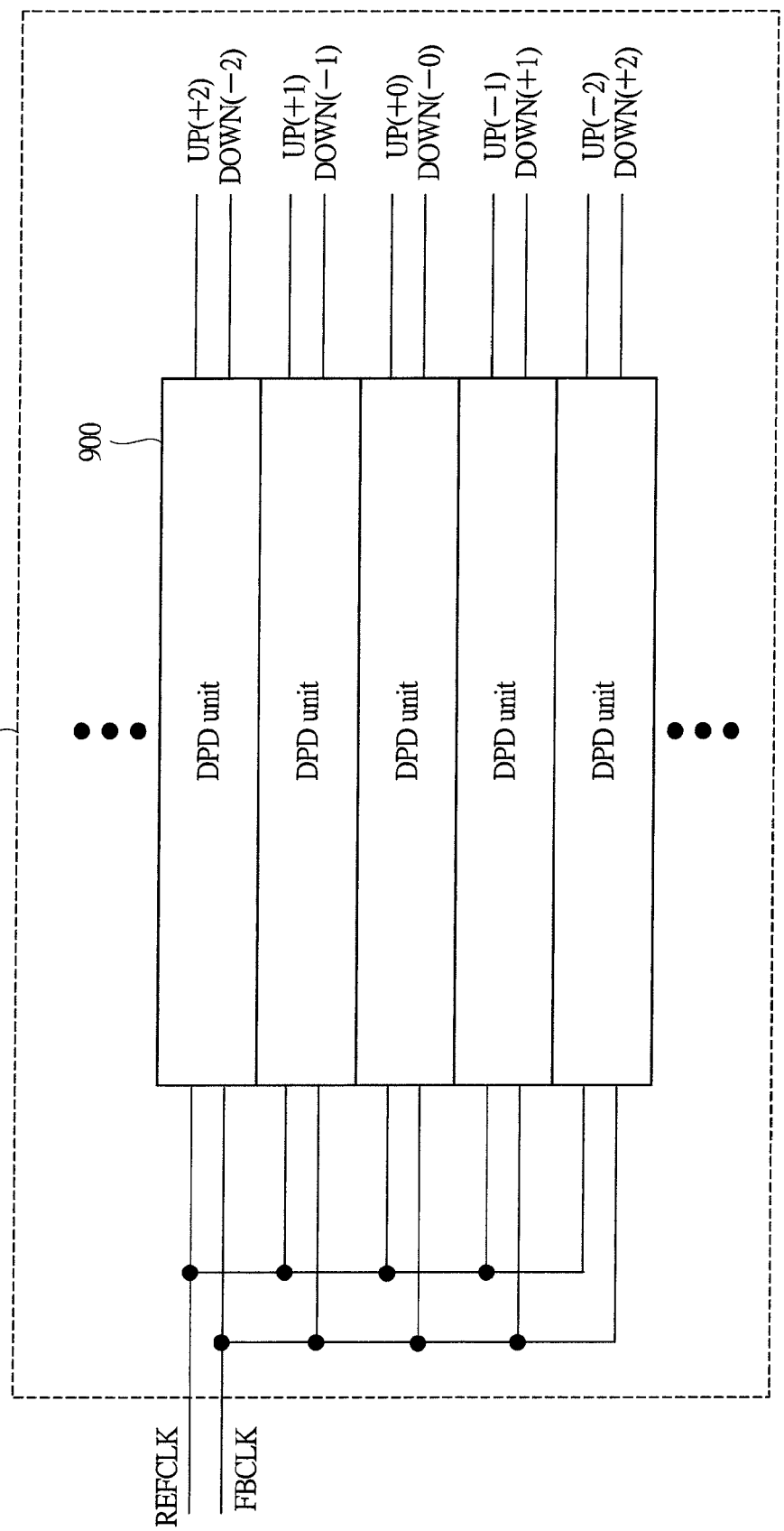
FIG. 9 is a block diagram describing the configuration of a digital phase comparator in the semiconductor device according to an embodiment of the present invention.
Figure 10:
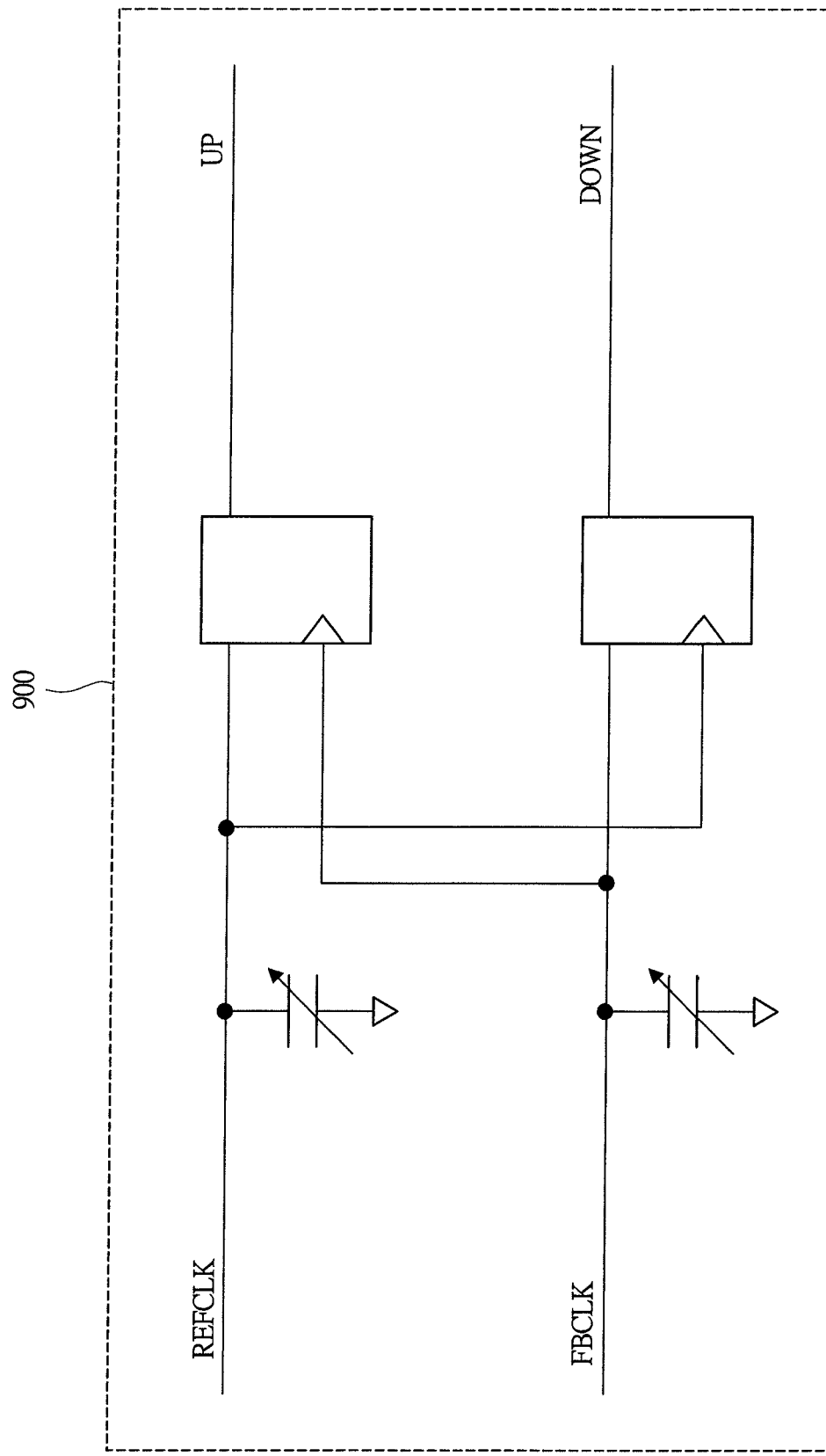
FIG. 10 is a block diagram describing the configuration of one unit of the digital phase comparator in the semiconductor device according to an embodiment of the present invention.

FIG. 9 is a block diagram describing the configuration of the digital phase comparator. FIG. 10 is a block diagram describing the configuration of one unit of the digital phase comparator. As shown in FIG. 9, the digital phase comparator 800 is made up of a plurality of phase comparator units 900 each having different detection sensitivities for UP signal and DOWN signal and connected in parallel to each other.

As a specific example, the phase comparator unit 900 is made up of two lines of variable capacitor and flip-flop as shown in FIG. 10, and has the configuration in which the phases of the reference clock (REFCLK) and the feedback clock (FBCLK) are compared and the UP signal is output for the phase delay and the DOWN signal is output for the phase lead. The variable capacitor for adjusting the detection sensitivity is connected to the inputs of the reference clock (REFCLK) and the feedback clock (FBCLK) of the phase comparator unit 900. For example, by increasing the load of the variable capacitor on the feedback clock (FBCLK) side, the sensitivity of the UP signal is increased.

The loop filter 103 of the present embodiment is formed of a second order low-pass filter, and has a large area because of the requirements for securing the phase margin and reducing the jitter. In order to secure the phase margin reduced by the area reduction of the loop filter 103, the digital compensation circuit 200 is added.

In the present embodiment, in order to secure the phase margin, the digital filter 800 is formed of a first order high-pass filter. There is possibility that the modulation from the digital compensation circuit 201 above the loop band of the phase locked loop circuit 100 may deteriorate the jitter as the high-frequency noise. However, since the voltage controlled oscillator 104 has an integration function to the modulation, the modulated high-frequency component decays as a linear function of frequency. Therefore, a filter shape which has high-pass characteristics on a low frequency side and is asymptotic to a unity gain on a high frequency side is employed. Furthermore, the first order high-pass filter has an effect of compensating the phase margin because it has a phase lead of +90°.

The digital filter 801 controls the number of activated capacitors of the MOS capacitor arrays 500 connected to the voltage controlled oscillator 104 based on the operation result.

The voltage controlled oscillator 104 maintains the oscillation by applying the analog controlled signal to the current source of the differential amplifier 300. By changing the number of activated MOS capacitor arrays 500 with the digital controlled signal (operation result of the digital filter 801) from the digital compensation circuit 201, the frequency modulation is performed to this oscillation. In the MOS capacitor array 500, a plurality of MOS capacitors with small area occupancy are connected, the number of activated MOS capacitors is decreased with respect to the phase delay and the number of activated MOS capacitors is increased with respect to the phase lead by the digital controlled signal of plural bits, thereby discretely modulating the frequency. In other words, the VCO gain is discretely changed with the control signal (digital controlled signal) from the digital compensation circuit 201 with respect to the consecutive VCO gains determined by characteristics of analog controlled voltage and the oscillation frequency.

In accordance with the operation result of the phase difference detected by the digital phase comparator 800, the capacitors of the MOS capacitor arrays 500 are turned ON and OFF at high speed with the digital controlled signal, thereby modulating the gain of the voltage controlled oscillator 104 determined by the analog controlled voltage and achieving the high-speed tracking (securing the phase margin).

Figure 11:
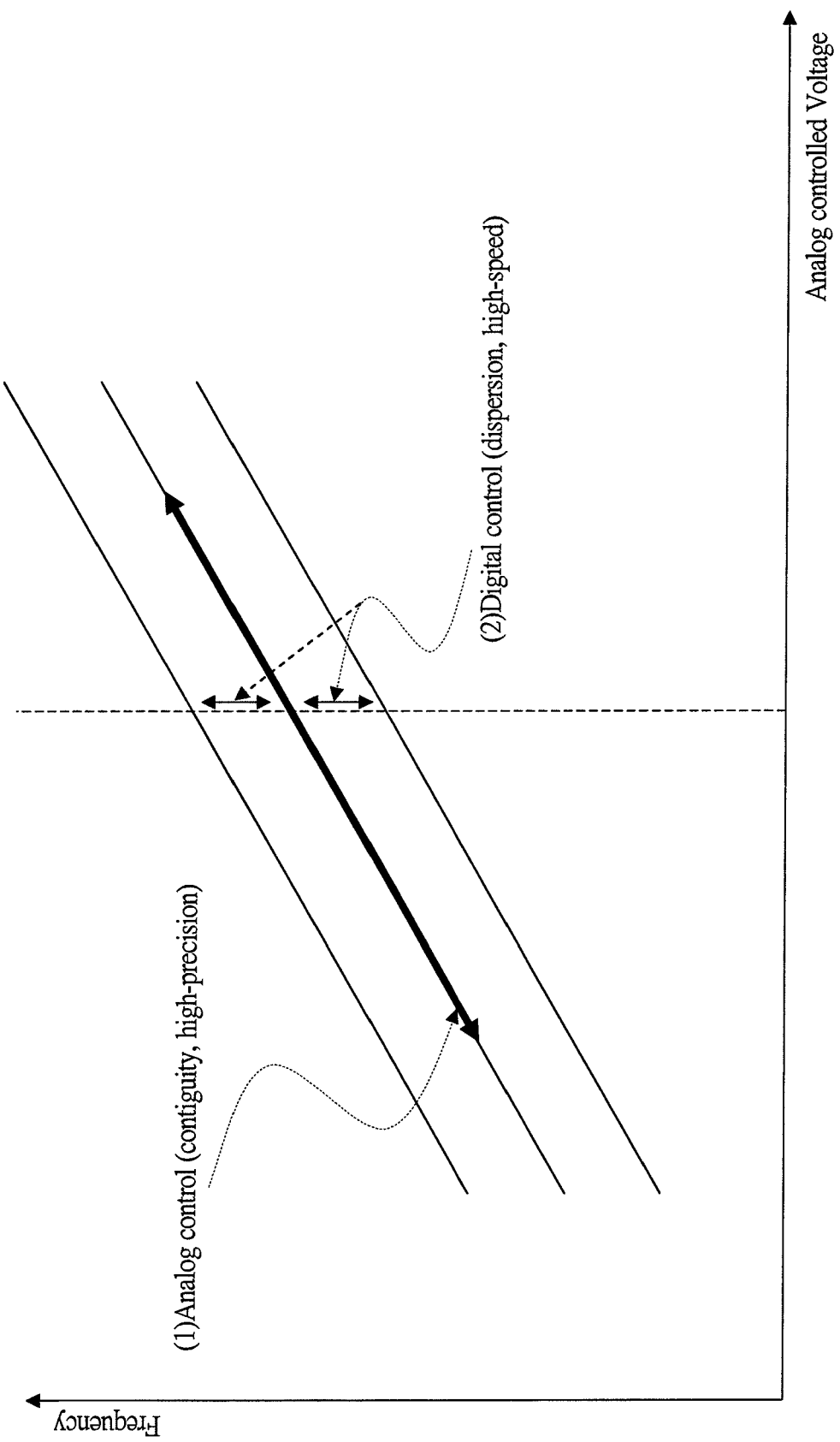
FIG. 11 is a conceptual diagram describing the frequency change of the voltage controlled oscillator in the semiconductor device according to an embodiment of the present invention.

FIG. 11 is a conceptual diagram describing the frequency change of the voltage controlled oscillator. FIG. 11 shows the operation of the frequency modulation by the analog controlled voltage and the digital controlled signal in the present embodiment.

When the phase difference is detected in the phase frequency comparator 101, the charge or discharge is made from the charge pump 102 to the loop filter 103 by the output UP signal or DOWN signal, and the analog controlled voltage is determined. The voltage controlled oscillator 104 controls the oscillation frequency in accordance with the value of the analog controlled voltage. At this time, the highly accurate tracking is contiguously performed along the line of (1) Analog control in FIG. 11.

The phase difference detected by the digital phase comparator 800 with a different detection sensitivity from that of the phase frequency comparator 101 is converted to the digital controlled signal having the phase information by the digital filter 801. The digital controlled signal determines the number of activated MOS capacitors in the MOS capacitor arrays 500. In accordance with the increase and decrease of the number of activated MOS capacitors, the frequency is discretely modulated along the line of (2) Digital control in FIG. 11.

Figure 12:
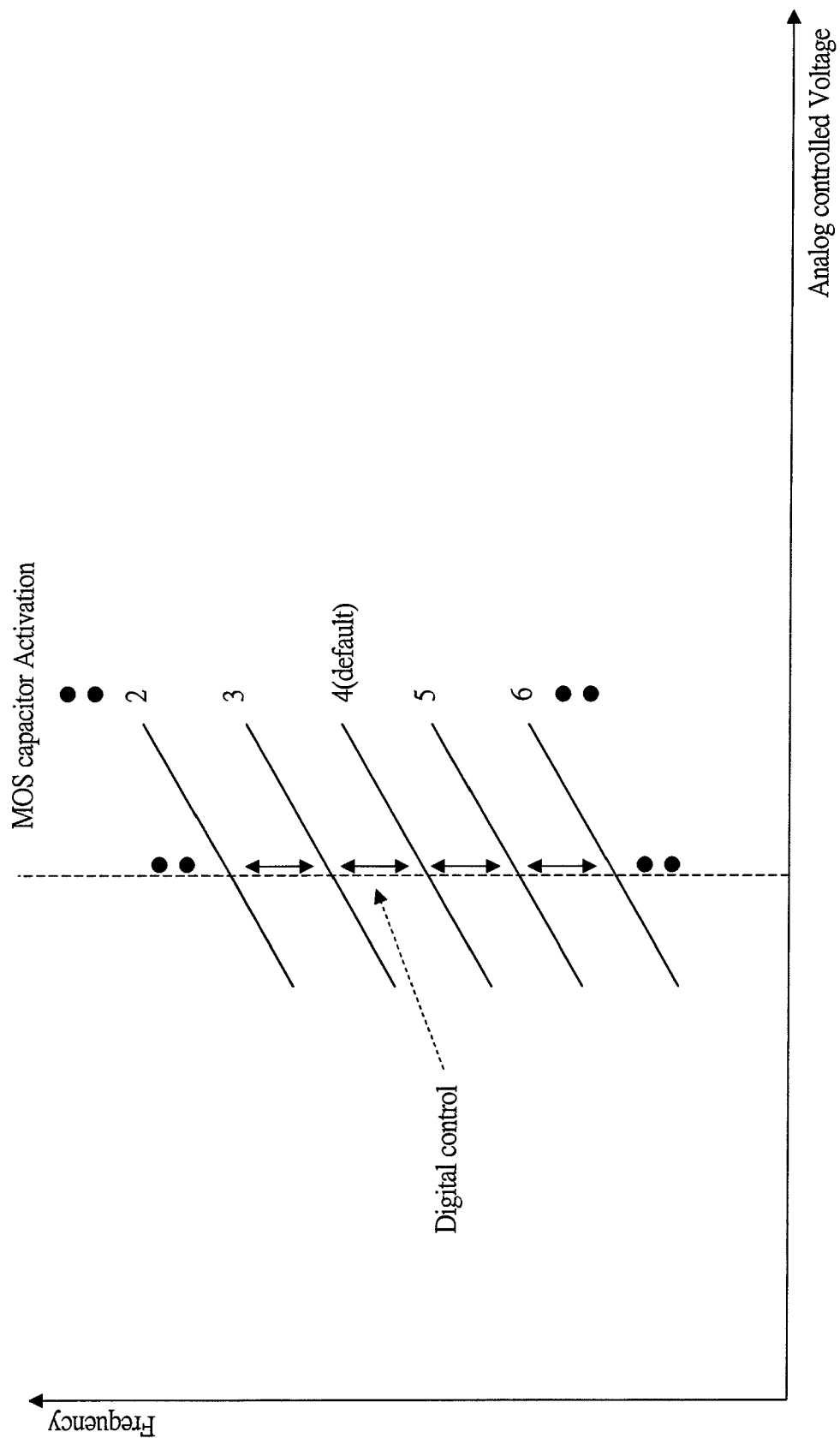
FIG. 12 is a conceptual diagram describing the frequency change by the MOS capacitor array in the semiconductor device according to an embodiment of the present invention.

FIG. 12 is a conceptual diagram describing the frequency change by the MOS capacitor array. FIG. 12 shows the discrete frequency change by the digital controlled signal based on the present embodiment. The MOS capacitor array 500 of the present embodiment includes 8 MOS capacitors, and it receives an 8-bit digital controlled signal from the digital compensation circuit 201. Based on the default of 4 capacitor loads, the number of capacitor loads is decreased to 3, 2, 1 and 0 with respect to the phase delay, and the number of capacitor loads is increased to 5, 6, 7 and 8 with respect to the phase lead.

The digital compensation phase locked loop circuit 200 dynamically controls the voltage controlled oscillator 104 by performing an operation of two signals having different sensitivities such as the UP/DOWN signal autonomously obtained by the phase locked loop circuit 100 and the UP/DOWN signal autonomously obtained by the digital compensation circuit 201. This is effective means for preventing the reduction of the phase margin due to the feedback delay and an external factor such as the environmental change and maintaining the stable oscillation.

In the present embodiment, the frequency of the voltage controlled oscillator 104 is changed by the MOS capacitors, but the method of changing the frequency is not limited to this as long as the desired frequency modulation can be dynamically performed, and the method of changing the driving strength of transistors is also applicable.

In the foregoing, the invention made by the inventors of the present invention has been concretely described based on the embodiment. However, it is needless to say that the present invention is not limited to the foregoing embodiment and various modifications and alterations can be made within the scope of the present invention.

The semiconductor device of the present invention can be utilized for the digital equivalent technology that replaces a part of an analog circuit such as a phase locked loop circuit with a digital circuit advantageous in process migration.

What is claimed is:

1. A semiconductor device comprising:
    a phase locked loop circuit including a voltage controlled oscillator having capacitors at oscillation nodes and consecutively controlled by an applied voltage; and
    a digital compensation circuit which variably controls the capacitors at the oscillation nodes of the voltage controlled oscillator in accordance with an input phase difference,
    wherein, during a normal operation mode of the phase locked loop circuit, the voltage controlled oscillator is dynamically calibrated based on a first signal having a first sensitivity generated by the phase locked loop circuit in response to the input phase difference, and a second signal having a second sensitivity generated by the digital compensation circuit in response to the input phase difference wherein the digital compensation circuit includes at least one or more digital phase comparators and at least one or more digital filters as an equivalent circuit of an analog control unit of the phase locked loop circuit, and changes the capacitors connected to the oscillation nodes of the voltage controlled oscillator whose VCO gain is determined by an applied voltage, and wherein the digital phase comparator includes at least one or more phase comparator units each having different input sensitivities for a reference clock and a divided clock and connected in parallel, and outputs an UP signal and a DOWN signal at respectively different sensitivities.

* * * * *